(12) United States Patent
Subramani et al.

(10) Patent No.: US 9,905,443 B2
(45) Date of Patent: *Feb. 27, 2018

(54) REFLECTIVE DEPOSITION RINGS AND SUBSTRATE PROCESSING CHAMBERS INCORPORATING SAME

(75) Inventors: Anantha K. Subramani, San Jose, CA (US); Joseph M. Ranish, San Jose, CA (US); Xiaoxiong Yuan, San Jose, CA (US); Ashish Goel, Karnataka (IN); Joung Joo Lee, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1286 days.

This patent is subject to a terminal disclaimer.

(21) Appl. No.: 13/598,828

(22) Filed: Aug. 30, 2012

(65) Prior Publication Data
US 2013/0055952 A1 Mar. 7, 2013

Related U.S. Application Data

(63) Continuation-in-part of application No. 13/046,261, filed on Mar. 11, 2011, now Pat. No. 8,404,048.

(51) Int. Cl.
*C23C 14/54* (2006.01)
*C23C 16/48* (2006.01)
(Continued)

(52) U.S. Cl.
CPC ...... *H01L 21/67115* (2013.01); *C23C 14/541* (2013.01); *C23C 16/481* (2013.01);
(Continued)

(58) Field of Classification Search
None
See application file for complete search history.

(56) References Cited

U.S. PATENT DOCUMENTS

| 4,560,420 A * | 12/1985 | Lord | C30B 13/06 |
| | | | 117/40 |
| 5,114,556 A * | 5/1992 | Lamont, Jr. | C23C 14/22 |
| | | | 204/192.12 |

(Continued)

FOREIGN PATENT DOCUMENTS

| JP | 2002-134429 A | 5/2002 |
| JP | 2002134429 A * | 5/2002 |

(Continued)

OTHER PUBLICATIONS

Virginia Semiconductor, "Your Guide to Semi Specifications for Si Wafers," pp. 3 Jun. 2002, available Mar. 18, 2014 online at https://www.virginiasemi.com/?cont_uid=27.*

(Continued)

*Primary Examiner* — Jeffrie R Lund
*Assistant Examiner* — Stanislav Antolin
(74) *Attorney, Agent, or Firm* — Moser Taboada; Alan Taboada

(57) ABSTRACT

Apparatus for improving temperature uniformity across a substrate are provided herein. In some embodiments, a deposition ring for use in a substrate processing system to process a substrate may include an annular body having a first surface, an opposing second surface, and a central opening passing through the first and second surfaces, wherein the second surface is configured to be disposed over a substrate support having a support surface to support a substrate having a given width, and wherein the opening is sized to expose a predominant portion of the support surface; and wherein the first surface includes at least one reflective portion configured to reflect heat energy toward a central axis of the annular body, wherein the at least one reflective portion has a surface area that is about 5 to about 50 percent of a total surface area of the first surface.

18 Claims, 4 Drawing Sheets

(51) Int. Cl.
*H01L 21/67* (2006.01)
*H01L 21/687* (2006.01)

(52) U.S. Cl.
CPC .. *H01L 21/67248* (2013.01); *H01L 21/68735* (2013.01); *H01L 21/68742* (2013.01)

(56) References Cited

U.S. PATENT DOCUMENTS

| | | | |
|---|---|---|---|
| 5,763,856 A | 6/1998 | Ohkase | |
| 5,803,977 A * | 9/1998 | Tepman | C23C 14/50 118/715 |
| 5,876,573 A * | 3/1999 | Moslehi | C23C 14/3407 204/192.12 |
| 5,942,042 A * | 8/1999 | Gogh | H01J 37/34 118/500 |
| 6,034,356 A * | 3/2000 | Paranjpe | C23C 16/481 219/390 |
| 6,034,863 A * | 3/2000 | Marohl | H01L 21/6833 279/128 |
| 6,108,491 A | 8/2000 | Anderson | |
| 6,122,440 A * | 9/2000 | Campbell | F21V 7/06 118/725 |
| 6,221,217 B1 * | 4/2001 | Moslehi | C23C 14/3407 204/192.12 |
| 6,222,990 B1 | 4/2001 | Guardado et al. | |
| 6,313,027 B1 | 11/2001 | Xu et al. | |
| 6,333,509 B1 * | 12/2001 | Lumpp | F21V 7/005 250/504 R |
| 6,394,023 B1 * | 5/2002 | Crocker | C23C 14/564 116/201 |
| 6,423,636 B1 * | 7/2002 | Dordi | H01L 21/2885 257/E21.175 |
| 6,435,869 B2 | 8/2002 | Kitamura | |
| 6,620,736 B2 * | 9/2003 | Drewery | C23C 14/04 118/720 |
| 6,818,864 B2 | 11/2004 | Ptak | |
| 7,043,148 B1 * | 5/2006 | Powell | H01L 21/67115 118/50.1 |
| 7,378,618 B1 | 5/2008 | Sorabji et al. | |
| 8,404,048 B2 * | 3/2013 | Ewert | C23C 14/541 118/715 |
| 2001/0027969 A1 * | 10/2001 | Takahashi | H05B 3/0047 219/390 |
| 2001/0034004 A1 | 10/2001 | Kitamura | |
| 2002/0053513 A1 * | 5/2002 | Stimson | H01J 37/32431 204/298.15 |
| 2002/0171922 A1 * | 11/2002 | Shiraishi | G02B 5/08 359/359 |
| 2003/0075109 A1 * | 4/2003 | Arai | C23C 16/4581 118/728 |
| 2003/0098126 A1 * | 5/2003 | Yeom | C23F 4/00 156/345.39 |
| 2003/0098291 A1 * | 5/2003 | Yeom | C23F 4/00 216/63 |
| 2003/0211757 A1 * | 11/2003 | Gondhalekar | C23C 16/45563 438/788 |
| 2004/0083976 A1 * | 5/2004 | Meyyappan | C23C 14/564 118/728 |
| 2004/0089542 A1 * | 5/2004 | Liu | C23C 4/00 204/298.11 |
| 2004/0149715 A1 | 8/2004 | Timans et al. | |
| 2005/0078953 A1 * | 4/2005 | Fodor | C23C 16/4585 392/418 |
| 2005/0191044 A1 | 9/2005 | Aderhold et al. | |
| 2005/0223993 A1 | 10/2005 | Blomiley et al. | |
| 2006/0090706 A1 * | 5/2006 | Miller | C23C 14/50 118/728 |
| 2006/0219172 A1 * | 10/2006 | Kuo | C23C 14/50 118/720 |
| 2007/0020872 A1 | 1/2007 | Shindo et al. | |
| 2007/0102286 A1 * | 5/2007 | Scheible | C23C 14/3407 204/298.01 |
| 2007/0125646 A1 * | 6/2007 | Young | C23C 14/3407 204/298.12 |
| 2007/0170052 A1 * | 7/2007 | Ritchie | C23C 14/3407 204/298.12 |
| 2007/0209931 A1 * | 9/2007 | Miller | H01L 21/68735 204/298.11 |
| 2007/0215283 A1 * | 9/2007 | Kobayashi | H01J 37/32477 156/345.43 |
| 2007/0218302 A1 * | 9/2007 | Kobayashi | C23C 4/02 428/469 |
| 2007/0241454 A1 * | 10/2007 | Chen | H01L 21/68735 257/724 |
| 2008/0110401 A1 * | 5/2008 | Fujikawa | C23C 16/4583 118/724 |
| 2008/0141942 A1 * | 6/2008 | Brown | C23C 14/564 118/723 R |
| 2008/0152330 A1 * | 6/2008 | Camm | H01L 21/68728 392/418 |
| 2008/0169282 A1 | 7/2008 | Sorabji et al. | |
| 2008/0178801 A1 * | 7/2008 | Pavloff | H01J 37/32477 118/504 |
| 2008/0317564 A1 * | 12/2008 | Cheng | C23C 14/50 414/217.1 |
| 2009/0025636 A1 * | 1/2009 | Rasheed | H01L 21/68721 118/500 |
| 2009/0050272 A1 * | 2/2009 | Rosenberg | C23C 14/50 156/345.51 |
| 2009/0080136 A1 * | 3/2009 | Nagayama | H01L 21/6831 361/234 |
| 2009/0184262 A1 * | 7/2009 | Bartel | A61L 2/087 250/492.3 |
| 2009/0208667 A1 * | 8/2009 | Harada | C23C 4/02 427/551 |
| 2009/0229971 A1 * | 9/2009 | Ishihara | C23C 14/50 204/192.13 |
| 2009/0245761 A1 * | 10/2009 | Nakajima | F27B 17/0025 392/416 |
| 2009/0260982 A1 * | 10/2009 | Riker | C23C 14/34 204/298.11 |
| 2009/0272647 A1 * | 11/2009 | Young | H01J 37/32623 204/298.11 |
| 2010/0029066 A1 * | 2/2010 | Miyashita | C23C 16/4584 438/478 |
| 2010/0040768 A1 * | 2/2010 | Dhindsa | H01J 37/32642 427/8 |
| 2010/0059181 A1 * | 3/2010 | Lee | H01J 37/32623 156/345.51 |
| 2010/0243431 A1 * | 9/2010 | Kuboi | G01N 23/00 204/192.33 |
| 2010/0271610 A1 * | 10/2010 | Soer | B82Y 10/00 355/67 |
| 2011/0061812 A1 | 3/2011 | Ganguly et al. | |
| 2011/0126984 A1 * | 6/2011 | Kang | H01J 37/32642 156/345.51 |
| 2011/0175527 A1 | 7/2011 | Ramer et al. | |
| 2011/0262115 A1 * | 10/2011 | Yokouchi | H01L 21/324 392/407 |
| 2012/0042825 A1 * | 2/2012 | Hawrylchak | C23C 16/4585 118/504 |
| 2012/0067864 A1 * | 3/2012 | Kusuda | H01L 21/67115 219/385 |
| 2012/0104789 A1 | 5/2012 | Plavetich et al. | |
| 2012/0155082 A1 | 6/2012 | Ramer et al. | |
| 2012/0231633 A1 | 9/2012 | Ewert et al. | |
| 2012/0244725 A1 * | 9/2012 | Fuse | H01L 21/26513 438/799 |
| 2013/0078786 A1 * | 3/2013 | Fuse | H01L 21/2686 438/478 |
| 2013/0182121 A1 * | 7/2013 | Huppertz | G02B 5/0808 348/164 |
| 2013/0196514 A1 * | 8/2013 | Ewert | C23C 14/541 438/760 |
| 2013/0259457 A1 * | 10/2013 | Yokouchi | H01L 21/67115 392/416 |

(56) References Cited

U.S. PATENT DOCUMENTS

2013/0264035 A1* 10/2013 Goel .................. C23C 14/50
                                                                        165/135
2013/0270107 A1* 10/2013 Ewert ................ C23C 14/541
                                                                       204/298.09
2014/0262763 A1* 9/2014 Rasheed ........... H01L 21/68735
                                                                       204/298.07

FOREIGN PATENT DOCUMENTS

| KR | 10-2007-0041959 A | | 4/2007 | |
|---|---|---|---|---|
| KR | 20070041959 A | * | 4/2007 | |
| WO | WO 2008135069 A1 | * | 11/2008 | ........... G02B 5/0808 |

OTHER PUBLICATIONS

"Predominant, adj. and n." in Oxford English Dictionary (OED) Online. Source location: Oxford University Press http://www.oed.com/viewdictionaryentry/Entry/149890. Available: http://www.oed.com/. Accessed: Mar. 27, 2016.*

"Plasma" in Intro Material: Cover Page, Preface, Introduction of J. D. Callen. "Fundamentals of Plasma Physics." 2006. pp. i-vi & pp. 1-4. Source location: University of Wisconsin—Madison, Engineering Physics Department http://homepages.cae.wisc.edu/~callen/cpintro.pdf. Accessed: Sep. 24, 2016.*

"Chapter 7: Changing Wafer Size and the Move to 300mm" in Integrated Circuit Engineering Corporation. "Cost Effective IC Manufacturing 1998-1999." (1997) pp. 7-1-7-16. Source location: Smithsonian Institution http://smithsonianchips.si.edu/. Available: http://smithsonianchips.si.edu/ice/cd/CEICM/SECTION7.pdf. Accessed: Sep. 24, 2016.*

International Search Report and Written Opinion dated Dec. 26, 2013 for PCT Application No. PCT/US2013/056784.

International Search Report, PCT/US2012/028521, dated Oct. 31, 2012.

Search Report for Taiwan Invention Patent Application No. 102121092 dated Nov. 21, 2016.

* cited by examiner

REFLECTIVE DEPOSITION RINGS AND SUBSTRATE PROCESSING CHAMBERS INCORPORATING SAME

CROSS-REFERENCE TO RELATED APPLICATIONS

This application is a continuation in part of U.S. patent application Ser. No. 13/046,261, filed Mar. 11, 2011, entitled, "Off-Angled Heating of the Underside of a Substrate Using a Lamp Assembly," which is herein incorporated by reference in its entirety.

FIELD

Embodiments of the present invention generally relate to semiconductor processing equipment and techniques.

BACKGROUND

Semiconductor substrates are often subjected to thermal treatment following a material process such as deposition of materials on a substrate containing features formed in the surface thereof. Temperature uniformity across the semiconductor substrate is critical during the thermal treatment to effectively reflow material deposited on the substrate during the deposition phase and provide a more conformal distribution of the material on the substrate and within the features. Some reflow chambers use a reflective surface to direct radiation toward the backside of the semiconductor substrate. However, space constraints within the reflow chamber substantially limit the area of the reflecting surface, adversely affecting the temperature uniformity of the semiconductor substrate.

Thus, the inventors have provided apparatus for processing substrates that, in at least some embodiments, improves temperature uniformity across a substrate.

SUMMARY

Apparatus for improving temperature uniformity across a substrate are provided herein. In some embodiments, a deposition ring for use in a substrate processing system to process a substrate may include an annular body having a first surface, an opposing second surface, and a central opening passing through the first and second surfaces, wherein the second surface is configured to be disposed over a substrate support having a support surface to support a substrate having a given width, and wherein the opening is sized to expose a predominant portion of the support surface; and wherein the first surface includes at least one reflective portion configured to reflect heat energy toward a central axis of the annular body, wherein the at least one reflective portion has a surface area that is about 5 to about 50 percent of a total surface area of the first surface.

In some embodiments, a deposition ring for use in a substrate processing system to process a substrate may include an annular body having a first surface, an opposing second surface, and a central opening passing through the first and second surfaces, wherein the second surface is configured to be disposed over a substrate support having a support surface to support a substrate having a given width, and wherein the opening is sized to expose a predominant portion of the support surface; and wherein the first surface includes at least one reflective portion configured to reflect heat energy toward a central axis of the annular body, wherein the at least one reflective portion has a surface area that is at least 5 percent of a total surface area of the first surface.

In some embodiments, a substrate processing chamber may include a substrate support having a support surface to support a substrate having a given width; a radiant energy source positioned at a peripheral region of the substrate processing chamber; a reflector disposed around the radiant energy source; and a deposition ring. The deposition ring may include an annular body having a first surface, an opposing second surface, and a central opening passing through the first and second surfaces, wherein the second surface is configured to be disposed over the substrate support, and wherein the opening is sized to expose a predominant portion of the support surface; and at least one reflective portion, disposed on the first surface and configured to reflect heat energy toward a central axis of the annular body, wherein the at least one reflective portion is about 5 to about 50 percent of a total surface area of the first surface.

Other embodiments and variations are discussed in more detail, below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
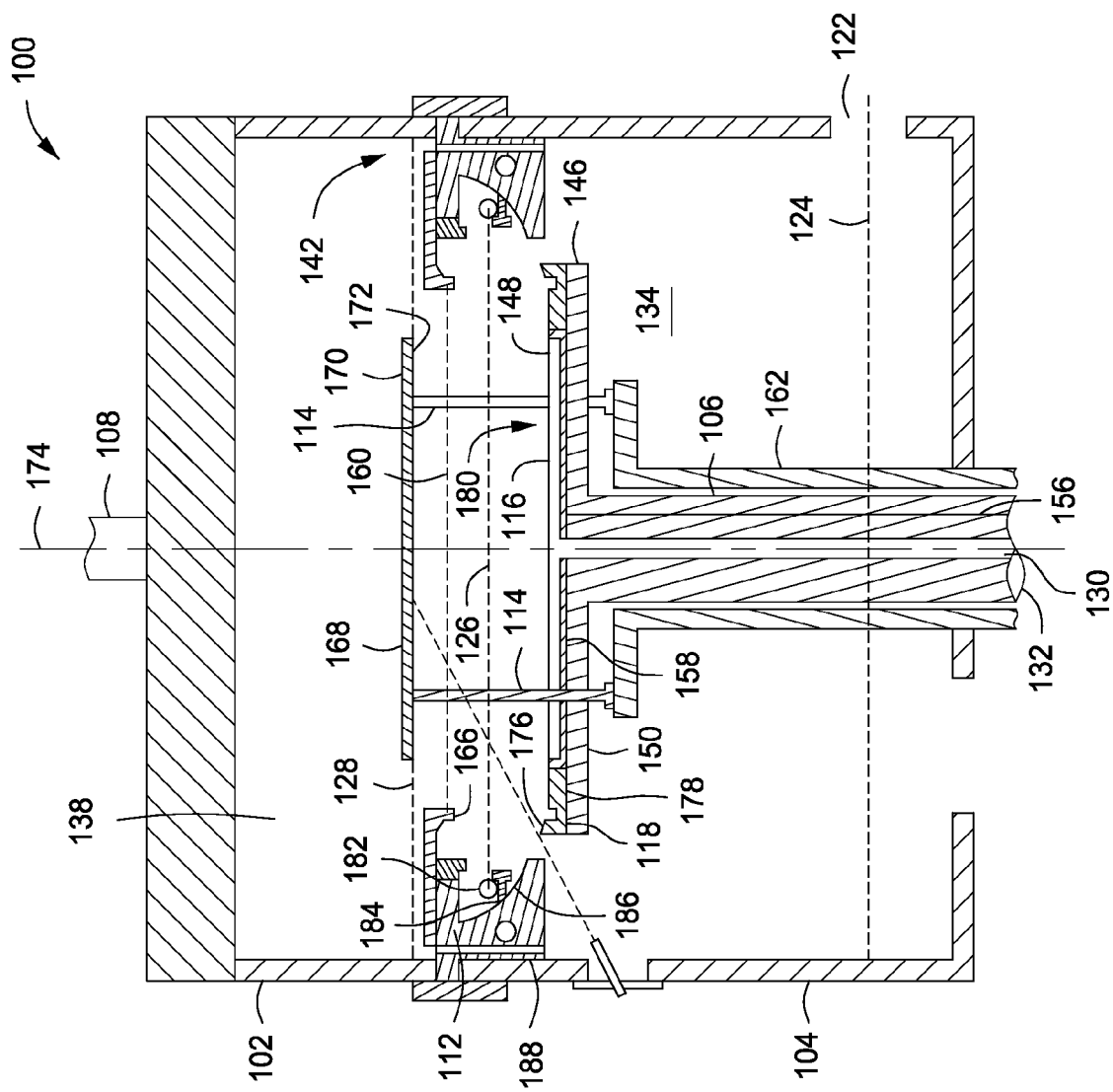
FIG. 1 is a schematic cross-sectional view of a chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the invention provide improved apparatus for processing substrates. In at least some embodiments, the apparatus may provide improved temperature uniformity across a substrate. For example, embodiments consistent with the present invention may be used in a dual-function chamber in which a normal deposition of material on a substrate is followed by a heating of that same substrate. Typically, a first surface of a substrate is highly reflective after material deposition on the first surface, and therefore heating the substrate by means of a high intensity light source on the reflective first surface of the substrate may be inefficient. However, a second surface of a substrate (e.g., a bottom surface), opposite the first surface, may be more absorptive of light energy and may provide better thermal coupling. Additionally, due to space limitations, heat sources must be located such that the movement of the pedestal would not be impeded. Therefore, the heat source may be located outside the periphery of a substrate support pedestal. In embodiments consistent with the present invention, a combination of reflective surfaces and protective shields are provided which reflect the heat energy from the peripheral heat sources towards a substrate.

FIG. 1 depicts a schematic cross-sectional view of a chamber 100 according to some embodiments of the present invention. The chamber 100 is configured for deposition of material on a first side of a substrate and irradiation on a second side of the substrate opposite the first side of the substrate. Such a chamber 100 is a dual-function chamber capable of performing both a material process and a thermal process on a substrate without removing the substrate from the chamber. In the case of a metal deposition process, the thermal process may be a reflow process, for example, to reduce the overhang of metal in recesses of the substrate.

The chamber 100 has a wall 104 and a lid portion 102 that enclose an interior volume 138 thereof. A substrate support 106 separates the interior volume 138 into an upper volume 136 and a lower volume 134. Process gases are admitted to the upper volume 136 of the chamber through an inlet 108 formed in the lid portion 102, and a substrate 168 disposed on a substrate receiving surface 116 of the substrate support 106 is exposed to the process gases at a processing location 160 of the chamber 100.

In operation, the substrate support 106 moves vertically within the chamber 100, extending and retracting to various positions at different stages of processing. For example, the substrate support 106 may be actuated vertically to move a substrate 168 disposed on the substrate receiving surface 116 of the substrate support 106 between the processing location 160 and a transportation location 124 of the chamber. The transportation location 124 defines a location of the substrate 168 at which a substrate handling apparatus (not shown) may manipulate a substrate 168 through a portal 122.

A plurality of lift pins 114 are disposed through the substrate receiving surface 116 of the substrate support 106. The plurality of lift pins 114 can be extended by actuator 162, moving independently of substrate support 106 by virtue of a motor (not shown) coupled to the actuator 162. For example, in some embodiments, the plurality of lift pins 114 can be actuated to lift and maintain a substrate 168 near the processing location 160 while the substrate support 106 retracts below the radiant source plane 126. In some embodiments, the substrate 168 may be positioned at a thermal processing location 128 different from the processing location 160, which may be a material processing location, by actuating the lift pins.

The substrate receiving surface 116 may incorporate an electrostatic chuck, which typically includes a conductor 158 disposed in an insulating substrate receiving surface 116. The conductor 158 may be a plate, a wire mesh, or a single-path wire circuitously routed through the substrate receiving surface 116. Power is typically coupled to the conductor 158 through a conduit 156 disposed through the shaft 132 of the substrate support. As the substrate receiving surface 116 engages the substrate 168, the electrostatic chuck may be energized to immobilize the substrate 168 on the substrate support 106. Cooling gas may also be established through the conduit 130 at that time.

The substrate support 106, with the substrate positioned thereon, moves the substrate 168 toward the processing locations 128 and 160. The substrate support 106, with the deposition ring 118 resting on the ledge 150, passes by the radiant source assembly 112 as the substrate support 106 rises toward the processing location 160. When the substrate receiving surface 116 reaches the processing location 160, the substrate 168 may be subjected to a material process, such as deposition, implant, or etch. As described below, the deposition ring 118 may be configured to engage the cover ring 166, which may be metal or ceramic, extending outward from the deposition ring 118 toward the lid portion 102. Engaging cover ring 166 improves the function of the deposition ring 118 by controlling gas flow from the upper volume 136 past the cover ring 166 into the lower volume 134. As the substrate support 106 moves toward the processing locations 160 and 128, the deposition ring 118 engages the cover ring 166. As the substrate support 106 moves toward the processing location 128 from the processing location 160, the cover ring 166 moves with the deposition ring 118 and the substrate support 106.

A radiant source assembly 112 is disposed at a periphery 142 of the chamber 100 and defines a radiant source plane 126 that is between the processing location 160 and the transportation location 124. The radiant source assembly 112 typically surrounds the substrate support 106. The radiant source assembly 112 includes a housing 188, a radiant energy source 182, at least one support 184 that protrudes from the housing 188 and supports the radiant energy source 182, and a reflective surface 186 of the housing 188. The housing 188 is generally made of a thermally conductive material, such as metal, for example stainless steel. The support 184 may be a thermally conductive material, such as metal, for example stainless steel, or a refractive material such as ceramic. The radiant energy source 182 may be a lamp producing radiation at wavelengths from the infrared to the violet, or a microwave, millimeter wave, terahertz wave, sub-millimeter wave, or far-infrared source. The radiant energy source 182 may produce radiation having wavelengths from about $5 \times 10^{-2}$ m to about $1 \times 10^{-7}$ m. Exemplary radiant energy sources include heat lamps, halogen lamps, arc lamps, and coaxial microwave or millimeter wave sources.

The reflective surface 186 of the housing 188 is shaped to reflect radiation from the radiant energy source 182 toward the back side 172 of a substrate 168 positioned at the processing locations 128 or 160. In some embodiments, the reflective surface 186 of the housing 188 is shaped to allow substantially uniform irradiation of the substrate. The reflective surface 186 of the housing 188 may have any desired shape, such as cylindrical, toroidal, elliptical, oval, or an irregularly curved shape. The reflective surface 186 of the housing 188 may be faceted in addition to, or instead of, being curved. In some embodiments, the reflective surface 186 of the housing 188 may be joined segments of cylinders having the same or different radii of curvature, each of which may also be tapered or faceted in part. In some embodiments, the reflective surface 186 of the housing 188 is a half-toroid. In some embodiments, the reflective surface 186 of the housing 188 comprises a plurality of reflective pieces, each of which may independently be substantially flat, curved, tapered, or faceted, the reflective pieces positioned so as to approximate a curved surface. The supports 184 are typically discontinuous, for example support pins, rods, or bumps, so that radiation from the radiant energy source 182 reaches substantially the entire reflective surface 186 of the housing 188 and reflects toward the backside 172 of the substrate 168.

A deposition ring 118 is disposed around an edge 148 of the substrate receiving surface 116. The deposition ring 118 may be metal or metal-coated ceramic, for example stainless steel, aluminum oxide, or the like. In general, the deposition ring 118 is formed from materials resistant to high temperature processing. In addition, as discussed below, the first surface 176 of the deposition ring 118 is reflective.

The deposition ring 118 substantially covers an outer extent 146 of the substrate support 106 to prevent deposition thereon. The deposition ring includes an annular body having a first surface 176 and an opposing second surface 178. The second surface 178 rests, for example, on a ledge 150 formed in the outer extent 146 of the substrate receiving surface 116. In some embodiments, the deposition ring has a diameter of about 12 to about 15 inches. The deposition ring also includes an opening 180 disposed through a center of the deposition ring 118. The opening 180 disposed through the center of the deposition ring 118 is sized to expose a predominant portion of the substrate receiving surface 116. In some embodiments, a substrate 168 disposed on the substrate receiving surface 116 contacts the deposition ring 118. In alternate embodiments, the substrate 168 may have an outer radius less than an inner radius of the deposition ring 118, such that the substrate 168 does not contact the deposition ring 118.

After processing at the processing location 160 is complete, the substrate support 106 may be positioned for back-side thermal processing of the substrate 168. Any chucking of the substrate 168 is disengaged by interrupting power to the conductor 158 (or vacuum to the substrate receiving surface in a vacuum chuck embodiment), the substrate support 106 retracts, and the lift pins 114 are actuated into an extended position. This disengages the substrate 168 from the substrate receiving surface 116, and maintains the substrate 168 at the processing location 160 as the substrate support 106 retracts to the thermal processing position below the radiant source plane 126. The substrate back side is thereby exposed to radiation from the radiant source assembly 112. If desired, the substrate 168 may be moved to a thermal processing location 128 different from the processing location 160 by actuating the lift pins. In such embodiments, the processing location 160 may be a material processing location. The thermal processing location may be located above or below the material processing location, as desired, depending on the energy exposure needs of specific embodiments. A substrate 168 is shown in FIG. 1 in a thermal processing position.

During thermal processing, the radiant source assembly 112 is powered and energy radiates from the radiant source assembly 112 toward the back side of the substrate 168. The back side of the substrate 168 is the substrate surface 172 opposite the surface 170 on which a material process was performed. Besides providing an integrated material and thermal processing chamber, irradiating the back side 172 of the substrate 168 in this fashion may improve energy efficiency of the thermal process by irradiating a less reflective surface of the substrate 168. In some embodiments, the material process performed on the substrate 168 forms a reflective layer or partial layer on the surface 170 that reduces energy absorption. Irradiating the back side 172 avoids the increased reflectivity. Moreover, the reflectivity of the surface 170 may reflect radiation from the radiant source assembly 112 that travels through the substrate 168 back through the substrate 168 for further efficiency improvement.

As mentioned above, the deposition ring 118 comprises a first surface 176 configured to increase the amount of radiation reflected from the radiant energy source 182 toward the substrate positioned at the processing location 160 (e.g., at least portions of the first surface is configured to reflect radiation radially inward toward a centerline 174 of the process chamber). In some embodiments, the deposition ring 118 may be configured as an extension of the reflective surface 186 of the radiant source assembly 112.

In some embodiments, the first surface 176 is textured to enhance adhesion of material deposited on the first surface 176, thereby reducing any flaking of the deposited material built up on the first surface 176 of the deposition ring 118 during substrate processing. In some embodiments, the first surface 176 has a roughness of about 80 to about 100 micro inches RMS.

Figure 2:
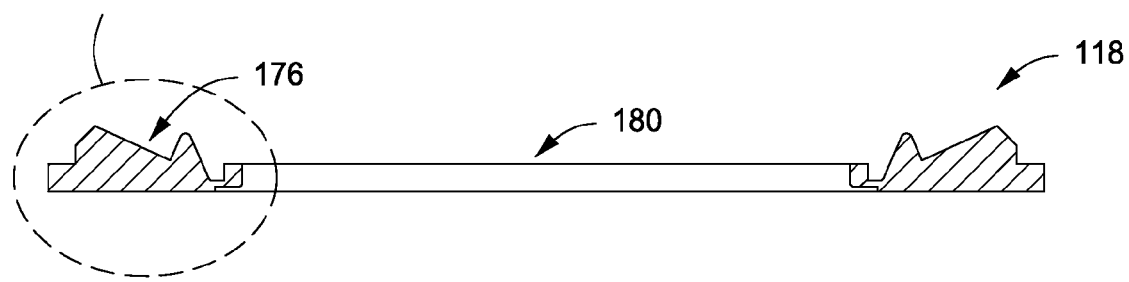
FIG. 2 depicts a schematic view of a deposition ring in accordance with some embodiments of the present invention.
Figure 2A:
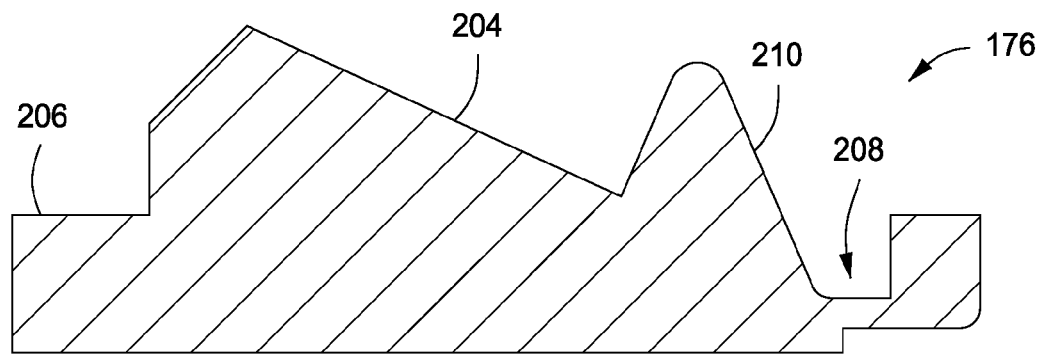
FIG. 2A depicts a cross-sectional side view of a deposition ring in accordance with some embodiments of the present invention.
Figure 3A:
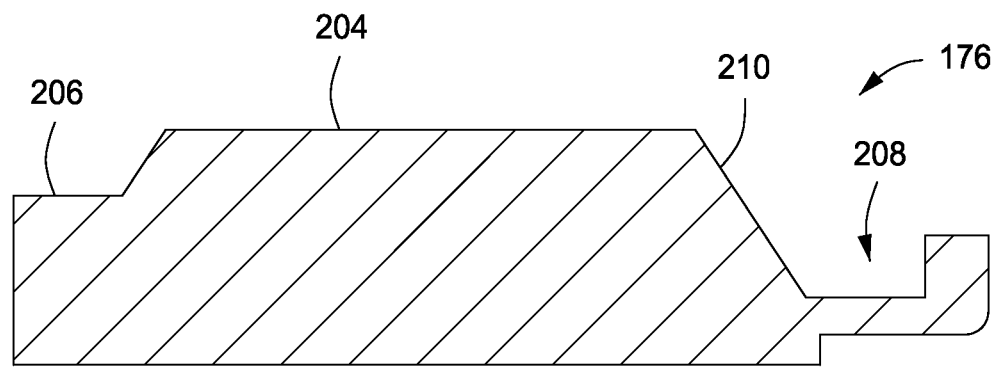
FIGS. 3A-C respectively depict cross-sectional side views of deposition rings in accordance with some embodiments of the present invention.
Figure 3B:
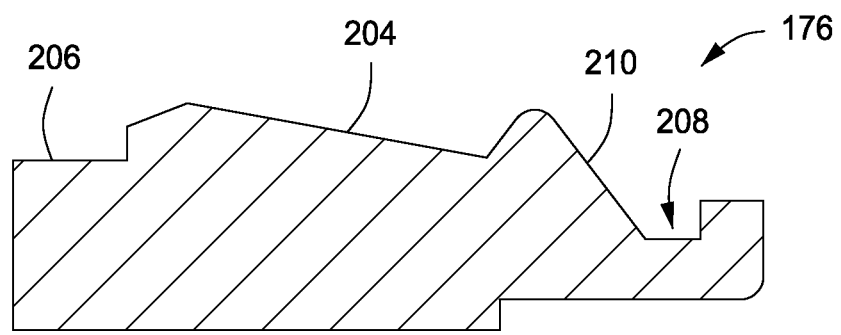
Figure 3C:
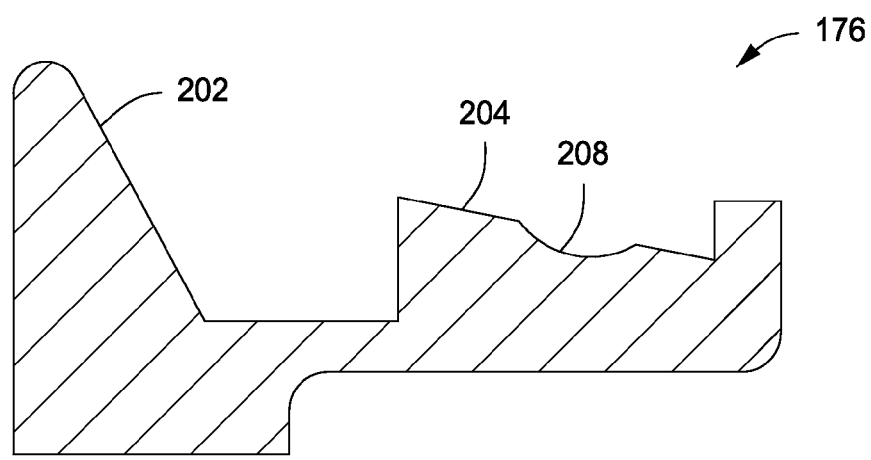

FIG. 2 shows a cross sectional side view of an exemplary deposition ring 118 in accordance with some embodiments of the present invention. FIG. 2A depicts a detailed cross-sectional side view of the deposition ring 118 of FIG. 2. FIGS. 3A-C depict various non-limiting exemplary embodiments of the first surface 176 of the deposition ring.

In some embodiments, as depicted in FIGS. 2-2A and 3A-C, the first surface 176 of the deposition ring 118 comprises at least one reflective portion 204 that is configured to reflect light energy towards a central axis of the deposition ring. For example, as depicted in FIGS. 2A and 3A-B, the first surface 176 of the deposition ring 118 may include one reflective portion 204. The first surface 176 of the deposition ring 118 may also include more than one reflective portion 204, as depicted in FIG. 3C. Although the entire first surface 176 of the deposition ring 118 may be reflective, as used herein with respect to the deposition ring, the term reflective surface or reflective portion of a surface is used to describe the surface that is configured to reflect light energy toward the central axis of the deposition ring.

In some embodiments, the reflective portion 204 comprises a predominant portion of the first surface 176. For example, in some embodiments, the reflective portion 204 is about 5 to about 50 percent of the first surface 176. The reflective portion 204 is configured to reflect heat energy toward a central axis 174 of the annular body. In some embodiments, the reflective portion is angled toward a central axis of the annular body at an angle of about 0 to about 30 degrees, or up to about 30 degrees. A first surface 176 comprised predominantly of at least one reflective portion 204 and configured to reflect heat energy toward a central axis 174 of the annular body advantageously increases the amount of radiation directed toward the backside 172 of the substrate, thereby improving the temperature non-uniformity of the substrate. The increase in the amount of radiation directed toward the backside 172 of the substrate is advantageously performed within the space constraints of the reflow chamber.

In some embodiments, the reflective portion 204 of the deposition ring 118 is coated with a reflective material prior to putting the deposition ring 118 into the chamber. In some embodiments, the deposition ring 118 is coated with a reflective material within the chamber 100. The reflective portion 204 may be coated with a reflective material such as copper, gold, aluminum or the like The reflective portion 204 of the deposition ring 118 is curved and/or faceted in a way that is compatible with the curvature and/or faceting of the reflective surface 186 of the housing 188, such that the reflective surface 186 of the housing 188 and the reflective portion 204 of the deposition ring 118 together form a composite reflector configured to direct as much radiation as possible, as uniformly as possible, from the radiant energy source 182 to the substrate back side positioned above the radiant energy source 182.

In some embodiments, the first surface 176 includes a sloped surface 210. In FIGS. 2A and 3A-B, the reflective portion 204 is disposed proximate the sloped surface 210. The sloped surface advantageously acts to facilitate containment of deposited materials and/or to guide the substrate 168 into position as it is lowered within the central opening of the deposition ring 118. In some embodiments, the sloped surface 210 may also be a reflective portion (e.g., a second reflective portion), similar to reflective portion 204.

In some embodiments, as depicted in FIGS. 2A and 3A-B, the first surface 176 comprises a flat portion 206 disposed proximate an outer periphery of the deposition ring 118 to engage a cover ring 166, which may be metal or ceramic, extending outward from the deposition ring 118 toward the lid portion 102. The cover ring 166 and flat portion 206 improve the function of the deposition ring 118 by controlling gas flow from the upper volume 136 past the cover ring 166 into the lower volume 134. As the substrate support 106 moves toward the processing locations 160 and 128, the deposition ring 118 engages the cover ring 166. As the substrate support 106 moves toward the processing location 128 from the processing location 160, the cover ring 166 moves with the deposition ring 118 and the substrate support 106

In some embodiments, as depicted in FIGS. 2A and 3A-B, the first surface 176 includes a groove 208. In some embodiments, the groove 208 may be disposed radially inward of the flat portion 206. During substrate processing, the groove 208 advantageously provides a reservoir for the buildup of deposition material. In some embodiments, the sloped surface 210 may be disposed proximate, or adjacent to, the groove 208. For example, in some embodiments, the sloped surface 210 may form one wall of the groove 208.

Figure 4:
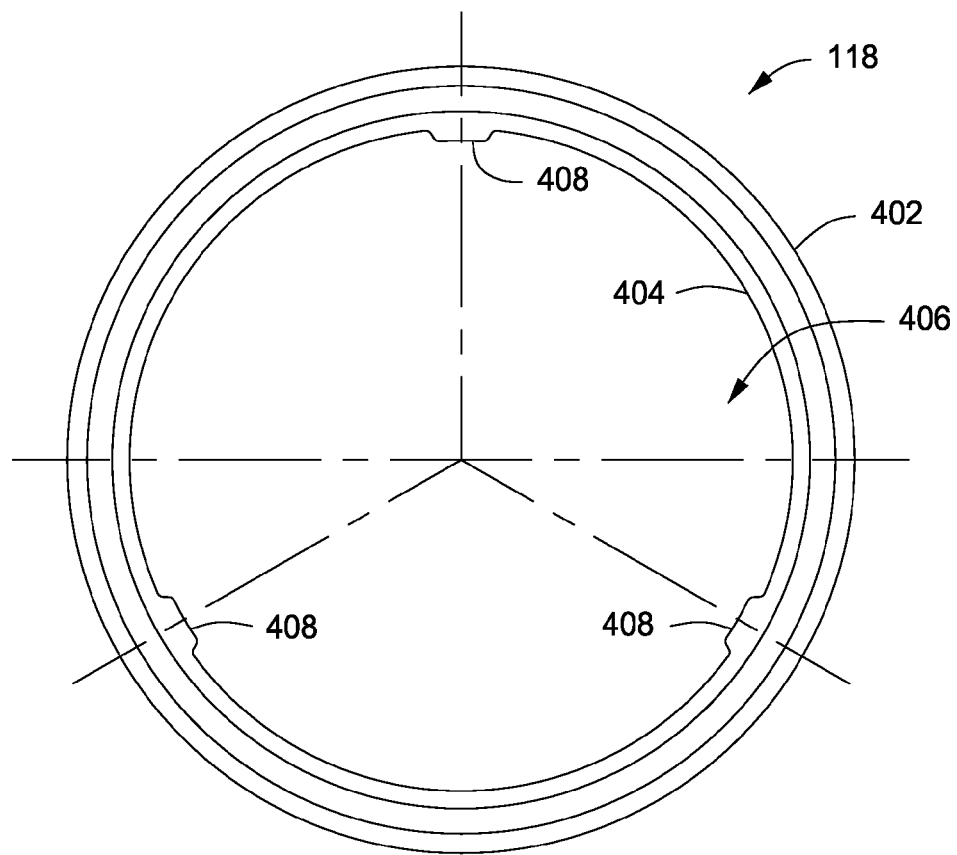
FIG. 4 is a top view of an exemplary deposition ring in accordance with some embodiments of the present invention.

FIG. 4 is a top view of an exemplary deposition ring 118 in accordance with some embodiments of the present invention. The deposition ring 118 includes an outer diameter 402, an inner diameter 404, and a central opening 406. In some embodiments, the deposition ring 118 may include one or more tabs 408 which may assist in positioning the deposition ring.

Referring back to FIG. 1, after thermal processing is complete, the substrate is typically re-engaged with the substrate receiving surface 116 by retracting the lift pins 114. Chucking may be re-applied, and cooling gas re-established to cool the substrate. The substrate support 106 may then be moved into position for further processing, if desired, or back to the transportation location for retrieval of the substrate. When the substrate support 106 is positioned at the transportation location, access to the substrate is provided by extending the lift pins 114 so that a robot blade may be inserted between the substrate and the substrate receiving surface 116.

The substrate need not be positioned at the same location for material (i.e., deposition or implant) and thermal processing. In the foregoing description, it is suggested that the processing location 160 is the same during material and thermal processing, but it is not required to be so. For example, a thermal processing location may be different from a material processing location. The substrate may be raised or lowered from a material processing location to a thermal processing location. The location of the thermal processing location with respect to the material processing location generally depends on design of the radiant source and the needs of the material process.

Thus, improved apparatus for improving temperature uniformity across a substrate have been disclosed herein. The inventive apparatus may advantageously facilitate a reflow step to enable material deposited onto the sidewalls of the feature to move to the bottom of the feature, thereby reducing the aspect ratio of a structure.

While the foregoing is directed to embodiments of the invention, other and further embodiments of the invention may be devised without departing from the basic scope thereof.

The invention claimed is:

1. A deposition ring for use in a substrate processing system to process a substrate, comprising:
    an annular body having a first surface, an opposing second surface, and a central opening passing through the first and second surfaces,
    wherein the second surface is configured to be disposed over a substrate support having a support surface to support a substrate having a given width;
    wherein the opening is sized to expose a predominant portion of the support surface;
    wherein the first surface comprises:
        at least one reflective portion angled toward a central axis of the annular body and configured to reflect heat energy toward the central axis of the annular body, wherein the at least one reflective portion has a surface area that is about 5 to about 50 percent of a total surface area of the first surface;
        a sloped surface disposed radially inward of the at least one reflective portion, wherein the sloped surface is annular; and
        a flat portion disposed proximate an outer periphery of the deposition ring, the flat portion having an upper surface disposed below a radially outermost portion of the reflective portion.

2. The deposition ring of claim 1, wherein the at least one reflective portion is coated with a reflective material.

3. The deposition ring of claim 1, wherein the annular body further comprises a groove disposed in the first surface and configured to receive a buildup of deposition material during substrate processing.

4. The deposition ring of claim 3,
    wherein the sloped surface is disposed proximate the groove,
    wherein the sloped surface is configured to position the substrate over the central opening when the substrate is present, and
    wherein the sloped surface forms a radially outer wall of the groove and extends above a radially inner wall of the groove.

5. The deposition ring of claim 1, wherein the first surface has a roughness of about 80 to about 100 micro-inches RMS.

6. The deposition ring of claim 1, wherein the deposition ring has a diameter of about 12 to about 15 inches.

7. The deposition ring of claim 1, wherein a slope of the at least one reflective portion is up to about 30 degrees.

8. The deposition ring of claim 1, wherein the annular body includes a plurality of reflector surfaces, each of which are angled to reflect heat energy towards the substrate when present.

9. The deposition ring of claim 1, wherein the annular body further comprises a first step connecting the second surface to an inner diameter of the annular body.

10. A deposition ring for use in a substrate processing system to process a substrate, comprising:
  an annular body having a first surface, an opposing second surface, and a central opening passing through the first and second surfaces, wherein the second surface is configured to be disposed over a substrate support having a support surface to support a substrate having a given width, and wherein the opening is sized to expose a predominant portion of the support surface;
  wherein the first surface comprises:
    at least one reflective portion angled toward a central axis of the annular body and configured to reflect heat energy toward the central axis of the annular body, wherein the at least one reflective portion has a surface area that is at least 5 percent of a total surface area of the first surface;
    a sloped surface disposed radially inward of the at least one reflective portion, wherein the sloped surface is annular; and
    a flat portion disposed proximate an outer periphery of the deposition ring, the flat portion having an upper surface disposed below a radially outermost portion of the reflective portion.

11. The deposition ring of claim 10, further comprising a groove recessed into the first surface of the annular body extending towards the second surface, wherein the groove is configured to receive build-up of deposition material during substrate processing.

12. The deposition ring of claim 11, wherein the sloped surface is disposed proximate the groove, wherein the sloped surface is configured to position the substrate over the central opening when the substrate is present, and wherein the sloped surface forms a radially outer wall of the groove and extends above a radially inner wall of the groove.

13. A substrate processing chamber, comprising:
  a substrate support having a support surface to support a substrate having a given width;
  a radiant energy source positioned at a peripheral region of the substrate processing chamber;
  a reflector disposed around the radiant energy source; and
  a deposition ring comprising:
    an annular body having a first surface, an opposing second surface, and a central opening passing through the first and second surfaces, wherein the second surface is configured to be disposed over the substrate support, and wherein the opening is sized to expose a predominant portion of the support surface;
    wherein the first surface comprises:
      at least one reflective portion angled toward a central axis of the annular body and configured to reflect heat energy toward the central axis of the annular body, wherein the at least one reflective portion has a surface area that is at least 5 percent of a total surface area of the first surface;
      a sloped surface disposed radially inward of the at least one reflective portion, wherein the sloped surface is annular; and
      a flat portion disposed proximate an outer periphery of the deposition ring, the flat portion having an upper surface disposed below a radially outermost portion of the reflective portion.

14. The substrate processing chamber of claim 13, wherein the annular body of the deposition ring further comprises a groove disposed in the first surface and configured to receive a build-up of deposition material during substrate processing, wherein the sloped surface is disposed proximate the groove, wherein the sloped surface is configured to position the substrate over the central opening when the substrate is present, and wherein the sloped surface forms a radially outer wall of the groove and extends above a radially inner wall of the groove.

15. The substrate processing chamber of claim 14, wherein the at least one reflective portion of the deposition ring is coated with a reflective material.

16. The substrate processing chamber of claim 13, the deposition ring further comprising an first surface with a roughness of about 80 to about 100 micro-inches RMS.

17. The substrate processing chamber of claim 13, wherein the reflector further comprises an upper reflector and a lower reflector.

18. The substrate processing chamber of claim 17, wherein the first surface of the deposition ring is an extension of the lower reflector.

* * * * *